(12) United States Patent
Stolpman et al.

(10) Patent No.: US 7,664,008 B2
(45) Date of Patent: Feb. 16, 2010

(54) APPARATUS, METHOD AND COMPUTER PROGRAM PRODUCT PROVIDING LOW-DENSITY PARITY-CHECK BLOCK LENGTH SELECTION

(75) Inventors: Victor Stolpman, Dallas, TX (US); Nico Van Waes, Keller, TX (US)

(73) Assignee: Nokia Corporation, Espoo (FI)

( * ) Notice: Subject to any disclaimer, the term of this patent is extended or adjusted under 35 U.S.C. 154(b) by 560 days.

(21) Appl. No.: 11/481,531

(22) Filed: Jul. 5, 2006

(65) Prior Publication Data

US 2008/0008083 A1    Jan. 10, 2008

(51) Int. Cl.
*H04J 11/00* (2006.01)
(52) U.S. Cl. .................. 370/203; 370/206; 714/752; 714/779
(58) Field of Classification Search .................. None
See application file for complete search history.

(56) References Cited

U.S. PATENT DOCUMENTS

| | | | | |
|---|---|---|---|---|
| 2005/0088998 A1* | 4/2005 | Douglas et al. | ............. | 370/338 |
| 2006/0218459 A1* | 9/2006 | Hedberg | .................... | 714/752 |
| 2007/0094580 A1* | 4/2007 | Livshitz | ...................... | 714/779 |

OTHER PUBLICATIONS

Saengudomlert, Tengo, "Space-Time Block Coding", Oct. 20, 2001, MIT, p. 1.*
IEEE 802.11-04/1362r0, IEEE P802.11 Wireless LANs, "Structured LDPC Code Design", Nov. 2004, 11 pgs.
Stolpman, V. et al., "Proposed LDPC Block Sizes and Concatenation Rules", Nokia, Apr. 25, 2005, 30 pgs.
IEEE P802.11, Wireless LANs, "TGn Sync Proposal Technical Specification", Jan. 6, 2005, 19 pgs.
IEEE P802.11, Wireless LANS, "TGn Sync Proposal Technical Specification", May 13, 2005, 131 pgs.
IEEE P802.11, Wireless LANs, TGn Sync Proposal Technical Specification:, Jul. 8, 2005, 133 pgs.
IEEE Std. for Local and Metropolitan Area Networks 802.16e, Part 16: Air Interface for Fixed and Mobile Broadband Wireless Access Systems, Feb. 28, 2006, pp. 626-630.
"Concatenation rules draft", Nokia, dated Jun. 3, 2005, disclosed Jun. 15, 2005 via email to WWISE consortium, 3 pgs.
"Unified PPDU Encoding Scheme," Conexant, Texas Instruments, CNXT-TXN-001.1, Jun. 14, 2005, 8 pgs.

(Continued)

*Primary Examiner*—Jinhee Lee
*Assistant Examiner*—Steve Young
(74) *Attorney, Agent, or Firm*—Harrington & Smith, PC

(57) ABSTRACT

A transmitter determines a number of available bits ($N_{avbits}$) in a minimum number of orthogonal frequency division multiplex (OFDM) symbols in which a data field of a packet may fit, by $N_{avbits} = (N_{CBPS}*(1+U_{STBC}))*\text{ceil}(N_{pld}/(N_{CBPS}*R*(1+U_{STBC})))$, where $U_{STBC}$ equals 1 when Space-Time Block Code (STBC) is used and 0 otherwise, where $N_{pld} = \text{LENGTH}*8+16$, where $N_{CBPS}$ is the number of coded bits per symbol, where R is the code rate, and where LENGTH is a number of bytes in a Physical Layer Convergence Protocol (PLCP) PLCP Service Data Unit (PSDU); and determines an integer number of Low-Density Parity-Check Code (LDPCC) codewords to be transmitted, $N_{CW}$, and the length of the codewords to be used, $L_{LDPC}$, from information capable of being expressed in a table format.

30 Claims, 5 Drawing Sheets

OTHER PUBLICATIONS

"Draft text for Section 20.3.5.7.1 and 20.3.5.7.3,", Conexant, Texas Instruments, Jun. 15, 2003, 4 pgs.

IEEE P802.11n™/D1.0, "Draft Amendment to Standard [for] Information Technology-Telecommunications and information exchange between systems-Local and Metropolitan networks-Specific requirements-Part 11: Wireless LAN Medium Access Control (MAC) and Physical Layer (PHY) specifications: Enhancements for Higher Throughput", Mar. 2006, pp. 1, 201-203, 253-255.

"Draft text for Section 11.2.4", Nokia TGn Sync, Oct. 26, 2004, 5 pgs.

* cited by examiner

| | | |
|---|---|---|
| STBC | 2 | INDICATES THE DIFFERENCE BETWEEN THE NUMBER OF SPACE TIME STREAMS, $N_{STS}$ AND NUMBER OF SPATIAL STREAMS $N_{SS}$ INDICATED BY THE MCS<br>00 – NO STBC ($N_{STS} = N_{SS}$) |
| ADVANCED CODING | 1 | 1 – LDPCC<br>0 – BCC |
| SHORT GI | 1 | SET TO 1 TO INDICATE THAT THE SHORT GI IS USED AFTER THE HT TRAINING SET TO 0 OTHERWISE |
| NUMBER OF EXTENSION HT-LTF | 2 | NUMBER OF EXTENSION SPATIAL STREAM(S) $N_{ESS}$ – b'00 – NO EXTENSION SPATIAL STREAM, b'01 – 1 ADDITIONAL SPATIAL STREAM, b'10 2– ADDITIONAL SPATIAL STREAM, b'11 3 ADDITIONAL SPATIAL STREAMS |
| CRC | 8 | CRC OF BITS 0-23 IN HT-SIG1 AND BITS 0-9 IN HT-SIG2 – SEE SUBCLAUSE 20.3.3.2.2.2.1. THE FIRST BIT TO BE TRANSMITTED IS BIT C7 AS EXPLAINED IN AFOREMENTIONED SUBCLAUSE |
| TAIL BITS | 6 | USED TO TERMINATE THE TRELLIS OF THE CONVOLUTION CODER. SET TO 0 |

NOTE 1– INTEGER FIELDS ARE TRANSMITTED LEAST SIGNIFICANT BIT FIRST.

NOTE 2 – A VALUE OF 0 IN THE LENGTH FIELD INDICATES A PPDU WHICH DOES NOT INCLUDE A DATA FIELD. THE PACKETS ENDS AFTER THE LAST HT-LTF OR THE HT-SIG.

FIG.2B

| FIG.2A |
|---|
| FIG.2B |

FIG.2

TABLE B
FIELDS OF HIGH THROUGHPUT SIGNAL FIELD

| FIELD NAME | NUMBER OF BITS | EXPLANATION AND CODING |
|---|---|---|
| MODULATION AND CODING SCHEME | 7 | INDEX INTO THE MCS TABLE, LSB FIRST |
| BW 20/40 | 1 | 0 IF 20MHz OR 40MHz UPPER/LOWER; 1 IF 40MHz |
| LENGTH | 16 | THE NUMBER OF BYTES OF DATA IN THE PSDU— 0-65535. SEE NOTE 2 |
| SMOOTHING | 1 | 1 – CHANNEL ESTIMATE SMOOTHING IS ALLOWED 0 – ONLY PER-CARRIER INDEPENDENT (UNSMOOTHED) CHANNEL ESTIMATE IS RECOMMENDED |
| NOT SOUNDING | 1 | INDICATES THAT THE PACKET IS A SOUNDING PACKET 0 – SOUNDING PACKET 1 – NOT A SOUNDING PACKET |
| RESERVED ONE | 1 | SET TO 1 |
| AGGREGATION | 1 | SET TO 1 TO INDICATE THAT THE PPDU IN THE DATA PORTION OF THE PACKET CONTAINS AN A-MPDU. SET TO 0 OTHERWISE |

FIG.2A

TABLE A (MODIFIED)

PPDU ENCODING PARAMETERS

| $N_{avbits}$ RANGE (BITS) | NUMBER OF LDPCC CODEWORDS $N_{CW}$ | LDPC CODEWORD LENGTH $L_{LDPC}$ (BITS) |
|---|---|---|
| $N_{avbits} \leq 648$ | 1 | 1296, IF $N_{avbits} \geq N_{pld} + 912 \times (1-R)$<br><br>648, OTHERWISE |
| $648 < N_{avbits} \leq 1296$ | 1 | 1944, IF $N_{avbits} \geq N_{pld} + 1464 \times (1-R)$<br><br>1296, OTHERWISE |
| $1296 < N_{avbits} \leq 1944$ | 1 | 1944 |
| $1944 < N_{avbits} \leq 2592$ | 2 | 1944, IF $N_{avbits} \geq N_{pld} + 2916 \times (1-R)$<br><br>1296, OTHERWISE |
| $2592 < N_{avbits}$ | $\text{ceil}(N_{pld}/(1944 \times R))$ | 1944 |

FIG.3

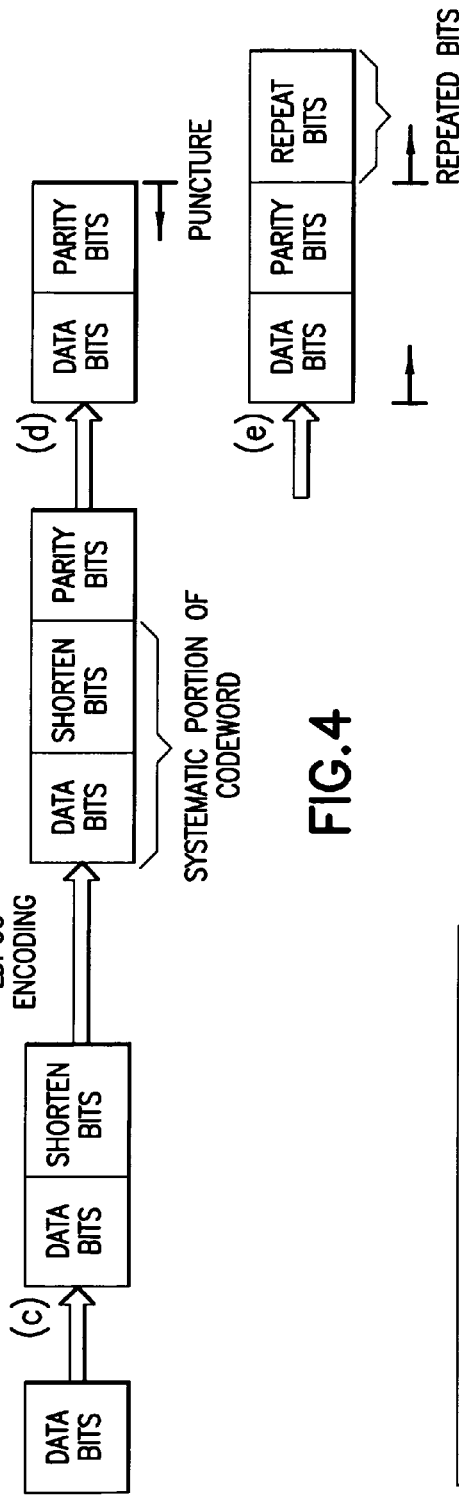

APPARATUS, METHOD AND COMPUTER PROGRAM PRODUCT PROVIDING LOW-DENSITY PARITY-CHECK BLOCK LENGTH SELECTION

TECHNICAL FIELD

The teachings in accordance with the exemplary embodiments of this invention relate generally to wireless communications systems, methods, devices and computer program products and, more specifically, relate to techniques for selecting a low-density parity-check (LDPC) block length in, for example, an orthogonal frequency division multiplex (OFDM) wireless communications system.

BACKGROUND

Additional abbreviations found in the patent application are defined as follows:
  BPSK Binary Phase Shift Keying
  DFT Discrete Fourier Transform
  FFT Fast Fourier Transform
  LDPCC Low-Density Parity-Check Code
  MAC Medium Access Control
  PHY Physical
  MCS Modulation Coding Scheme
  PLCP Physical Layer Convergence Protocol
  PSDU PLCP Service Data Unit
  PPDU PLCP Protocol Data Unit
  CBPS Coded Bits Per Symbol
  STBC Space-Time Block Code
  WLAN Wireless Local Area Network
  HT-SIG High Throughput Signal As wireless technology has advanced, a variety of wireless networks have been installed, such as cellular and other wireless networks. Some wireless networks are based upon the Institute of Electrical and Electronics Engineers (IEEE) 802.11 family of Wireless LAN (WLAN) industry specifications. Other wireless technologies are being developed, such as EEE 802.16, also referred to as WiMax, industry specifications. IEEE 802.16 defines the wireless air interface specification for wireless metropolitan area networks. A number of working groups are engaged in efforts to improve on this technology.

As is explained in, for example, IEEE802.16e™-2005, section 8.4.9.2.5.1, the LDPC code is based on a set of one or more fundamental LDPC codes. Each of the fundamental codes is a systematic linear block code. Using the method defined in section 8.4.9.2.5.2 (Code Rate and Block Size Adjustment), the fundamental codes can accommodate various blockcode rates and packet sizes. IEEE802.16e™-2005, sections 8.4.9.2.5.1 and 8.4.9.2.5.2 are incorporated by reference herein.

When using a small set of fixed length LDPC codes, a problem arises when attempting to utilize the LDPC codes in an OFDM transmission where the OFDM system has a fixed number of bits per OFDM symbol, for a given MCS, and a variety of data packet lengths. What can occur is that for a given MCS and a given packet length, there will exist some minimum number of OFDM symbols that allow for transmission of the data bits contained in a packet burst. The transmitter needs to then select a LDPC block size (i.e., codeword length) for the specified code rate and number of codewords to use in encoding of the information data bits. Then, the transmitter needs to map these code-bits onto the OFDM symbols using the modulation specified. Often times, however, the length of the packet payload data does match exactly the number of systematic bits (or integer multiple) of one of the codewords in the given set. When this occurs, the transmitter needs to determine the best possible choice of LDPC block size and the number of codewords to use.

Longer (larger) codewords benefit from better, more desirable coding gains relative to shorter (smaller) codewords (i.e., smaller codewords result in smaller coding gains).

Thus, if the transmitter uses too small of a codeword, then the transmission may suffer performance degradation relative to a longer codeword. On the other hand, if the transmission uses too large of a codeword, then the transmitter is required to (a) puncture too many codeword bits to fit in the finite period of transmission, resulting in a loss in link performance, or, (b) in order to avoid severely degraded decoding behavior due to excessive puncturing, the transmitter may need to send additional OFDM symbols beyond the minimum number of OFDM symbols that the packet may fit into, resulting in a longer transmission time for a given data rate. In either case, the transmitter uses more power than actually needed and may require a retransmission (possibly at a higher power) due to the additional OFDM symbols or performance loss. Thus, the communication system suffers throughput degradation due to this inefficient use of the air interface.

Various previous proposals have been directed to the foregoing problem(s). All such proposals known to the inventors, however, suffer from requiring the use of complicated algorithms or implementations when attempting to manage the performance versus air-time penalty trade-off. Some previous proposals would use a large set of codewords in an attempt to fit the codeword exactly or nearly exactly to the minimum number of OFDM epochs. Other previously proposed approaches suffer from poor performance due to the use of too small of a block size in situations when a larger block size may be used. Another drawback of the previously proposed approaches is the use of complicated block size switching algorithms that use a combination of reduced block lengths at the end of a packet, resulting in performance degradation. Yet another prior approach used a single codeword length, and did not attempt to achieve a more efficient packing with a multitude of codeword lengths.

SUMMARY OF THE EXEMPLARY EMBODIMENTS

The foregoing and other problems are overcome, and other advantages are realized, in accordance with the non-limiting and exemplary embodiments of this invention.

In accordance with exemplary embodiments of this invention there is provide a device, a computer program product, and a method, where the method includes determining a number of available bits ($N_{avbits}$) in a minimum number of orthogonal frequency division multiplex (OFDM) symbols in which a data field of a packet may fit, in accordance with $$N_{avbits} = (N_{CBPS}*(1+U_{STBC}))*\text{ceil}(N_{pld}/(N_{CBPS}*R*(1+U_{STBC}))),$$

where $U_{STBC}$ equals 1 when Space-Time Block Code (STBC) is used and 0 otherwise, where $N_{pld=LENGTH}*8+16$, where $N_{CBPS}$ is the number of coded bits per symbol, where R is the code rate, and where LENGTH is a number of bytes in a Physical Layer Convergence Protocol (PLCP)

PLCP Service Data Unit (PSDU); and determining an integer number of Low-Density Parity-Check Code (LDPCC) codewords to be transmitted, $N_{CW}$, and the length of the codewords to be used, $L_{LDPC}$, from information expressible in a Table format and comprising:

| $N_{avbits}$ range (bits) | Number of LDPCC codewords $N_{CW}$ | LDPC codeword length $L_{LDPC}$ (bits) |
|---|---|---|
| $N_{avbits} \leq 648$ | 1 | 648 |
| $648 < N_{avbits} \leq 1296$ | 1 | 1296 |
| $1296 < N_{avbits} \leq 1944$ | 1 | 1944 |
| $1944 < N_{avbits} \leq 2592$ | 2 | 1296 |
| $2592 < N_{avbits}$ | $\text{ceil}\dfrac{((\text{LENGTH} \times 8 + 16)}{(1944 \times R))}$ | 1944. |

Also disclosed in accordance with a further embodiment of this invention is a data structure tangibly embodied in a memory, the data structure defining information expressible in the Table format, where the Table is accessed, using the parameter $N_{avbits}$ that defines a number of available bits in a minimum number of orthogonal frequency division multiplex (OFDM) symbols in which a data field of a packet may fit, to obtain the integer number of Low-Density Parity-Check Code (LDPCC) codewords to be transmitted, $N_{CW}$, and the length of the codewords $L_{LDPC}$.

Also disclosed in accordance with a further embodiment of this invention is an integrated circuit that includes circuitry for coupling to a transceiver and operable to determine a number of available bits ($N_{avbits}$) in a minimum number of orthogonal frequency division multiplex (OFDM) symbols in which a data field of a packet may fit, in accordance with $$N_{avbits} = (N_{CBPS}*(1+U_{STBC}))*\text{ceil}(N_{pld}/(N_{CBPS}*R*(1+U_{STBC}))),$$

where $U_{STBC}$ equals 1 when Space-Time Block Code (STBC) is used and 0 otherwise,
where $N_{pld}$=LENGTH*8+16,
where $N_{CBPS}$ is the number of coded bits per symbol,
where R is the code rate, and
where LENGTH is a number of bytes in a Physical Layer Convergence Protocol (PLCP) PLCP Service Data Unit (PSDU); and to determine an integer number of Low-Density Parity-Check Code (LDPCC) codewords to be transmitted, $N_{CW}$, and the length of the codewords to be used, $L_{LDPC}$, from information expressible in the Table format.

Also disclosed in accordance with a still further exemplary and non-limiting embodiment of this invention is a method to operate a wireless receiver that comprises receiving a packet having a preamble that specifies a modulation coding scheme used at a transmitter and a packet payload size; and based on the modulation coding scheme and the packet payload size, determining a block size and a number of LDPCC codewords $N_{CW}$ in accordance with information expressible in the Table format.

In the foregoing exemplary and non-limiting embodiments of this invention the information expressible in the Table format may be provided in, for example, a look-up table (LUT) format, or the information may be provided programmatically and/or through the use of logic circuits that implement an if-elseif structure comprising:

```
if N_avbits ≤ 648 {
  N_CW=1;
  L_LDPC=648;
```

-continued

```
  }
  elseif 648 < N_avbits ≤ 1296 {
    N_CW=1;
    L_LDPC=1296;
  }
  elseif 1296 < N_avbits ≤ 1944 {
    N_CW=1;
    L_LDPC=1944;
  }
  elseif 1944 < N_avbits ≤ 2592 {
    N_CW=2;
    L_LDPC=1296;
  }
  elseif 2592 < N_avbits {
    N_CW= ceil ((LENGTH × 8 + 16) / (1944 × R));
    L_LDPC=1944;
  }.
```

BRIEF DESCRIPTION OF THE DRAWINGS

The foregoing and other aspects of the teachings of this invention are made more evident in the following Detailed Description, when read in conjunction with the attached Drawing Figures, wherein:

FIG. 2 is a Table (Table B) showing the fields of the HT-SIG.

FIG. 3 is a modified Table A showing the presence of optional if-then-else statements.

FIG. 4 reproduces Figure n60 "LDPCC PPDU encoding padding and puncturing of a single codeword" from IEEE P802.11n™/D1.0 (2006), section 20.3.4.3.3.4

FIG. 5 is a logic flow diagram in accordance with a method that is an exemplary embodiment of this invention.

DETAILED DESCRIPTION

Figure 1:
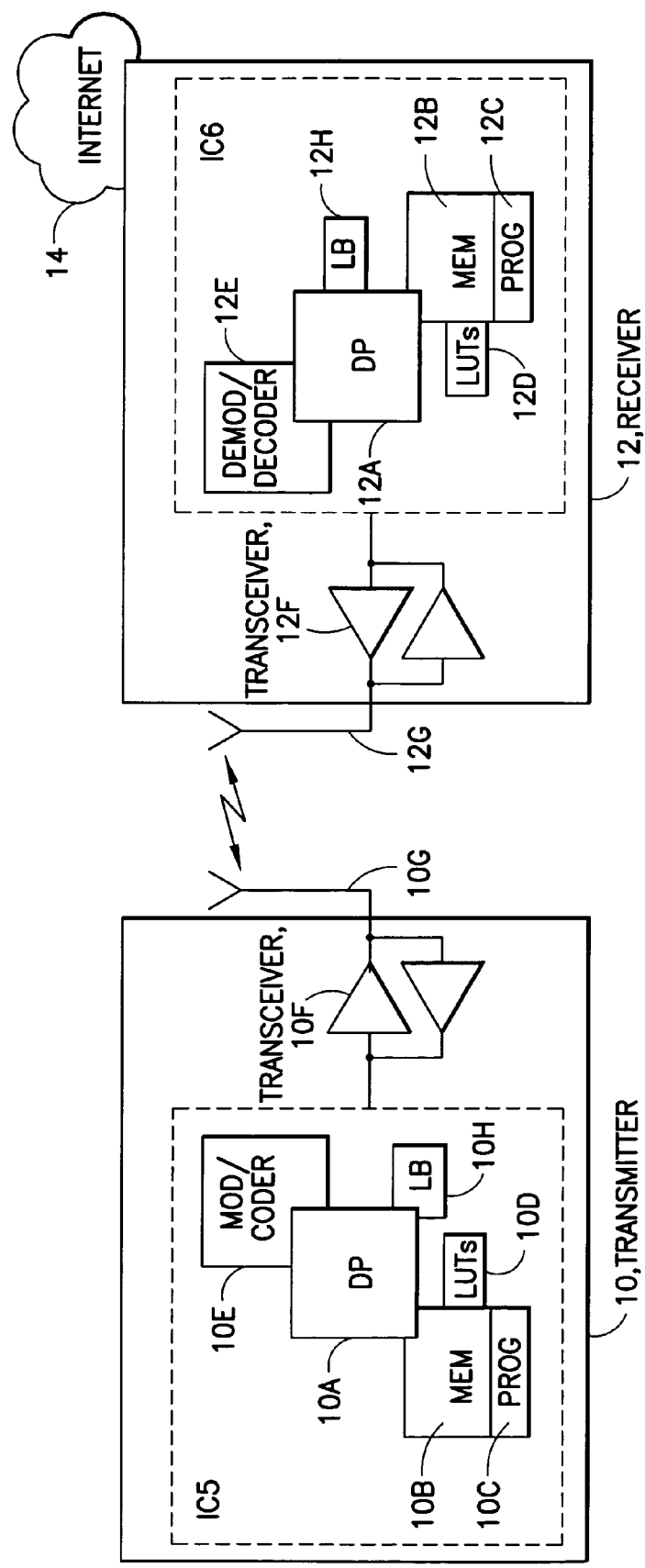
FIG. 1 is a simplified block diagram of apparatus that may be used when implementing the exemplary embodiments of this invention.

The exemplary embodiments of this invention may be advantageously employed with advanced coding schemes in OFDM communication systems that may use a plurality of modulation types, antennas and a finite number of coding schemes, although the use of the exemplary embodiments is not limited in this respect.

The exemplary embodiments of this invention operate to select a LDPC block size in an attempt to maximize the coding gains of a particular code rate using the largest possible codeword, while simultaneously attempting to minimize the number of OFDM symbols required for transmission of a packet.

Reference is made first to FIG. 1 for illustrating a simplified block diagram of various electronic devices that are suitable for use in practicing the exemplary embodiments of this invention. In FIG. 1 a wireless network, such as a WLAN network operable in accordance with IEEE 802.11, includes a transmitter 10 and a receiver 12. Note that during operation the roles may be reversed, such that the transmitter 10 becomes the receiver and the receiver 12 becomes the transmitter. The designations shown in FIG. 1 are for convenience only in describing the exemplary embodiments of this invention.

The transmitter 10 includes a data processor (DP) 10A, a memory (MEM) 10B that stores a program (PROG) 10C, and a suitable radio frequency (RF) transceiver 10F for bidirectional wireless communications with the receiver 12 via at least one antenna 10G. The transmitter 10 is assumed to include a modulator and an encoder function (MOD/CODER) 10E. The receiver 12 includes a DP 12A, a MEM 12B that stores a PROG 12C, and a suitable RF transceiver 12F for bidirectional wireless communications with the transmitter 10 via at least one antenna 12G. The receiver 12 is assumed to include a demodulator and a decoder function (DEMOD/DECODER) 12E that is the corollary to the MOD/CODER 10E. At least one of the PROGs 10C and 12C is assumed to include program instructions that, when executed by the associated DP, enable the electronic device to operate in accordance with the exemplary embodiments of this invention, as will be discussed below in greater detail.

Note that a number of these components/functions may be embodied in one or more integrated circuits (ICs) 5, 6. In practice, ICs 5 and 6 could be instances of the same IC. The memories 10B, 12B may be a part of the ICs 5, 6, respectively, or they may be implemented in whole or in part with components external to the ICs 5, 6. Similarly, the DPs 10A, 12A may be a part of the ICs 5, 6, respectively, or they may be implemented in whole or in part with components external to the ICs 5, 6. Similarly, the transceivers 10F, 12F may be a part of the ICs 5, 6, respectively, or they may be implemented in whole or in part with components external to the ICs 5, 6.

In general, the various embodiments of the transmitter 10, or in which the transmitter 10 may be embodied, can include, but are not limited to, cellular telephones, handsets, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions. The receiver 12 may be a WLAN access point (AP), or a base station (BS), and may be coupled to the Internet 14 and/or to a local area network (LAN).

The exemplary embodiments of this invention may be implemented by computer software executable by the DPs 10A, 12A, or by hardware, or by a combination of software and hardware (and firmware).

The MEMs 10B, 12B may be of any type suitable to the local technical environment and may be implemented using any suitable data storage technology, such as semiconductor-based memory devices, magnetic memory devices and systems, optical memory devices and systems, fixed memory and removable memory. The DPs 10A, 12A may be of any type suitable to the local technical environment, and may include one or more of general purpose computers, special purpose computers, microprocessors, digital signal processors (DSPs) and processors based on a multi-core processor architecture, as non-limiting examples.

In a first exemplary embodiment of this invention the transmitter 10 computes the number of available bits in the minimum number of OFDM symbols into which packet burst may fit in accordance with:

$$N_{avbits} = (N_{CBPS}*(1+U_{STBC}))*\text{ceil}((\text{LENGTH}|8+16)/(N_{CBPS}*R*(1+U_{STBC}))),$$

where $U_{STBC}$ equals 1 when STBC is used and 0 otherwise.

Next, the transmitter 10 computes the integer number of LDPCC codewords to be transmitted, $N_{CW}$, and the length of the codewords to be used, $L_{LDPC}$, from Table A. Note that Table A may be stored in the memory 10B in the form of a Look-Up-Table (LUT) 10D, and for the purposes of the exemplary embodiments of this invention may be deemed to define a data structure that is stored in the memory 10B.

TABLE A

PPDU encoding parameters

| $N_{avbits}$ range (bits) | Number of LDPCC codewords $N_{CW}$ | LDPC codeword length $L_{LDPC}$ (bits) |
|---|---|---|
| $N_{avbits} \leq 648$ | 1 | 648 |
| $648 < N_{avbits} \leq 1296$ | 1 | 1296 |
| $1296 < N_{avbits} \leq 1944$ | 1 | 1944 |
| $1944 < N_{avbits} \leq 2592$ | 2 | 1296 |
| $2592 < N_{avbits}$ | $\text{ceil}\dfrac{((\text{LENGTH} \times 8 + 16)}{(1944 \times R))}$ | 1944 |

It should be noted that the informational content of Table A may also be implemented and/or generated using an if-elseif structure in a computer program (e.g., the PROG 10C) residing in tangible memory (e.g., the memory 10B), or as a series of hardware comparisons using combinatory logic and arithmetic processing unit(s) (shown generally as logic block (LB) 10H). A complementary logic block 12H may be present in the receiver 12. Note that some or all of these combinatory logic and arithmetic processing unit(s) of LB 10H may comprise a part of the DP 10A.

That is, the exemplary embodiments of this invention may also be implemented in software and/or firmware and/or hardware using an if-elseif structure that comprises:

```
if N_avbits ≤ 648 {
    N_CW=1;
    L_LDPC=648;
}
elseif 648 < N_avbits ≤ 1296 {
    N_CW=1;
    L_LDPC=1296;
}
elseif 1296 < N_avbits ≤ 1944 {
    N_CW=1;
    L_LDPC=1944;
}
elseif 1944 < N_avbits ≤ 2592 {
    N_CW=2;
    L_LDPC=1296;
}
elseif 2592 < N_avbits {
    N_CW= ceil ((LENGTH × 8 + 16) / (1944 × R));
    L_LDPC=1944;
}
```

For the purposes of the exemplary embodiments of this invention the information content of the Table A may be considered to be equivalent to or substantially equivalent to that obtained by execution of the if-elseif structure shown immediately above.

With regards to $N_{CBPS}$, this parameter may be obtained by calculating from the MCS field of the TXVECTOR the number of data bits per OFDM symbol ($N_{DBPS}$), the coding rate (R), the number of coded bits in each OFDM subcarrier ($N_{BPSC}$), and the number of coded bits per OFDM symbol ($N_{CBPS}$). Examples of the foregoing may be found in section 20.7 "Rate Dependent Parameters for High Throughput Modulation and Coding Schemes (MCS)" of IEEE P802.11n™/D1.0 (2006), incorporated by reference herein in its entirety.

Another embodiment uses rate reduction as follows:

The transmitter 10 computes the number of available bits in the minimum number of OFDM symbols in which the burst may fit (as in the first embodiment):

$$N_{avbits}=(N_{CBPS}*(1+U_{STBC}))*\text{ceil}((\text{LENGTH}|8+16)/(N_{CBPS}*R*(1+U_{STBC}))),$$

where $U_{STBC}$ equals 1 when STBC is used and 0 otherwise.

Next, the transmitter 10 determines if a lower coding rate can be used to transmit the PPDU by computing the minimum code rate, $R_{min}$, that can be used to transmit the PPDU over $N_{avbits}$ bits:

$$R_{min}=(\text{LENGTH}|8+16)/N_{avbits}.$$

This procedure then selects the closest supported code rate within a given coderate set (e.g. $R \in \{1/2, 2/3, 3/4, 5/6\}$) that is larger than or equal to $R_{min}$ to use in the PPDU encoding process. The new code rate selection is given by $R_n \in \{1/2, 2/3, 3/4, 5/6\}$. For example, if $R_{min}=0.4$, then $R_n=1/2$, and if $R_{min}=0.65$, then $R_n=2/3$.

The transmitter 10 then computes the integer number of LDPCC codewords to be transmitted, $N_{CW}$, and the length of the codewords to be used, $L_{LDPC}$, from Table A using $R_n$ in place of R.

Additional if-then-else cases may be used as an option within the framework, as shown below in conjunction with yet another embodiment of this invention.

In accordance with a still further exemplary embodiment of this invention, the transmitter 10 computes the number of available bits in the minimum number of OFDM symbols in which the data field of the packet may fit:

$$N_{pld}=\text{LENGTH}*8+16$$

$$N_{avbits}=(N_{CBPS}*(1+U_{STBC}))*\text{ceil}(N_{pld}/(N_{CBPS}*R*(1+U_{STBC}))),$$

where where $U_{STBC}$ equals 1 when STBC is used and 0 otherwise, and where LENGTH is the value of a Length field in a HT-SIG field defined in Table B, shown in FIG. 2. This Table B may also be stored as a LUT 10D. The Length is defined as a number of bytes of data in the PSDU, and is specified (not by way of limitation) to have a value in the range of 0 to 65,535 bytes.

Next, the transmitter 10 computes the integer number of LDPCC codewords to be transmitted, $N_{CW}$, and the length of the codewords to be used, $L_{LDPC}$, from Table A.

Further in this regard, FIG. 3 shows a modified Table A wherein optional if-then-else statements are also employed. It should be noted that the use of these if-then-else statements is optional during the practice of the exemplary embodiments of this invention.

Note in the foregoing expressions that the parameter $1+U_{STBC}$ could be replaced with a variable (e.g., M) that equals 2 when STBC is used and that equals 1 otherwise.

It is pointed out that the foregoing techniques to determine the number of available bits and to compute the integer number of LDPC codewords to be transmitted may be viewed as preliminary operations in an overall LDPCC PPDU encoding process. If one assumes that these two operations are operations (a) and (b), then additional operations (c, d, e, f and g) that may be performed can include: (c) computing the number of shortening bits to be padded to the $N_{pld}$ data bits before encoding; (d) computing the number of bits to be punctured from the codewords after encoding; (e) computing the number of coded bits to be repeated; (f) encoding the data, using the number of shortening bits per codeword, and puncture or repeat bits per codeword; and (g) aggregating all codewords and parsing. FIG. 4 reproduces Figure n60 "LDPCC PPDU encoding padding and puncturing of a single codeword" from IEEE P802.11n™/D1.0 (2006), section 20.3.4.3.3.4, incorporated by reference herein in its entirety.

While the foregoing description has concentrated on the transmitter 10, it should be noted that similar procedures can be employed by the receiver 12. Note in this regard that when receiving a packet the preamble may specify the MCS that was used at the transmitter 10 and the payload size (or this information may be estimated at the receiver). Based on this information the receiver 12 can determine from information based on that of Table A (possibly stored in the LUTs 12D) the block size and the number of LDPCC codewords $N_{CW}$. In practice, the preamble may be transmitted using BPSK modulation with a rate ½ convolutional code. When correctly decoded, the receiver 12 has knowledge of $N_{CBPS}$, $U_{STBC}$ and R, and may thus determine the other information of interest.

The exemplary embodiments of this invention may be practiced in, as two non-limiting examples, the L2 (MAC) or L1 (PHY) protocol layers of the transmitter (and receiver).

The exemplary embodiments of this invention may be employed to advantage with equipment providing Enhanced Throughput WLAN support based on the IEEE 802.11n standard, in particular one that employs the LDPC advanced coding option.

In accordance with a method, and referring to FIG. 5, at Block 5A the transmitter 10 determines a number of available bits ($N_{avbits}$) in a minimum number of orthogonal frequency division multiplex (OFDM) symbols in which a data field of a packet may fit, $$N_{pld}=\text{LENGTH}*8+16,$$

$$N_{avbits}=(N_{CBPS}*(1+U_{STBC}))\text{ceil}(N_{pld}/(N_{CBPS}*R*(1+U_{STBC}))),$$

where $U_{STBC}$ equals 1 when Space-Time Block Code (STBC) is used and 0 otherwise, and where LENGTH is a value of a Length field;

and at Block 5B there is further determined an integer number of Low-Density Parity-Check Code (LDPCC) codewords to be transmitted, $N_{CW}$, and the length of the codewords to be used, $L_{LDPC}$, from the Table A (or from use of the exemplary if-elseif logical structure discussed above, which may be considered to be equivalents one to the other).

Provided below are further exemplary embodiments of the invention, described with numbered clauses.

(1) A method, comprising: determining a number of available bits ($N_{aivbits}$) in a minimum number of orthogonal frequency division multiplex (OFDM) symbols in which a data field of a packet may fit, in accordance with $$N_{avbits}=(N_{CBPS}*(1+U_{STBC}))*\text{ceil}(N_{pld}/(N_{CBPS}*R*(1+U_{STBC}))),$$

where $U_{STBC}$ equals 1 when Space-Time Block Code (STBC) is used and 0 otherwise, where $N_{pld}=\text{LENGTH}*8+16$, where $N_{CBPS}$ is the number of coded bits per symbol, where R is the code rate, and where LENGTH is a number of bytes in a Physical Layer Convergence Protocol (PLCP) PLCP Service Data Unit (PSDU); and determining an integer number of Low-Density Parity-Check Code (LDPCC) codewords to be transmitted, $N_{CW}$, and the length of the codewords to be used, $L_{LDPC}$, from information expressible in a Table format and comprising:

| $N_{avbits}$ range (bits) | Number of LDPCC codewords $N_{CW}$ | LDPC codeword length $L_{LDPC}$ (bits) |
|---|---|---|
| $N_{avbits} \leq 648$ | 1 | 648 |
| $648 < N_{avbits} \leq 1296$ | 1 | 1296 |
| $1296 < N_{avbits} \leq 1944$ | 1 | 1944 |
| $1944 < N_{avbits} \leq 2592$ | 2 | 1296 |
| $2592 < N_{avbits}$ | $\text{ceil}\dfrac{((LENGTH \times 8 + 16)}{(1944 \times R))}$ | 1944 |

(2) The method above, further comprising: computing a number of shortening bits to be padded to the $N_{pld}$ data bits before encoding; computing a number of bits to be punctured from the codewords after encoding; computing a number of coded bits to be repeated; encoding the data, using the number of shortening bits per codeword, and puncture or repeat bits per codeword; and aggregating all codewords and parsing.

(3) The method of (1), executed in a wireless transmitter device.

(4). The method of (2), executed in a wireless transmitter device.

(5) A device, comprising: a wireless transceiver; and circuitry coupled to the transceiver and operable to determine a number of available bits ($N_{avbits}$) in a minimum number of orthogonal frequency division multiplex (OFDM) symbols in which a data field of a packet may fit, in accordance with $$N_{avbits}=(N_{CBPS}*(1U_{STBC}))*\text{ceil}(N_{pld}/(N_{CBPS}*R*(1+U_{STBC}))),$$

where $U_{STBC}$ equals 1 when Space-Time Block Code (STBC) is used and 0 otherwise, where $N_{pld}$=LENGTH*8+16, where $N_{CBPS}$ is the number of coded bits per symbol, where R is the code rate, and where LENGTH is a number of bytes in a Physical Layer Convergence Protocol (PLCP) PLCP Service Data Unit (PSDU); and to determine an integer number of Low-Density Parity-Check Code (LDPCC) codewords to be transmitted, $N_{CW}$, and the length of the codewords to be used, $L_{LDPC}$, from information expressible in a Table format and comprising:

| $N_{avbits}$ range (bits) | Number of LDPCC codewords $N_{CW}$ | LDPC codeword length $L_{LDPC}$ (bits) |
|---|---|---|
| $N_{avbits} \leq 648$ | 1 | 648 |
| $648 < N_{avbits} \leq 1296$ | 1 | 1296 |
| $1296 < N_{avbits} \leq 1944$ | 1 | 1944 |
| $1944 < N_{avbits} \leq 2592$ | 2 | 1296 |
| $2592 < N_{avbits}$ | $\text{ceil}\dfrac{((LENGTH \times 8 + 16)}{(1944 \times R))}$ | 1944 |

(6) The device of (5), further comprising means for computing a number of shortening bits to be padded to the $N_{pld}$ data bits before encoding; for computing a number of bits to be punctured from the codewords after encoding; for computing a number of coded bits to be repeated; for encoding the data, using the number of shortening bits per codeword, and puncture or repeat bits per codeword; and for aggregating all codewords and parsing.

(7) The device of (5), further comprising a memory that stores a Table that comprises the information.

(8) The device of (6), further comprising a memory that stores computer program instructions the execution of which results in generating the information expressible in the Table format.

(9) The device of (8), where certain of the computer program instructions implement an if-elseif structure comprising:

```
if N_avbits ≤ 648 {
    N_CW=1;
    L_LDPC=648;
}
elseif 648 < N_avbits ≤ 1296 {
    N_CW=1;
    L_LDPC=1296;
}
elseif 1296 < N_avbits ≤ 1944 {
    N_CW=1;
    L_LDPC=1944;
}
elseif 1944 < N_avbits ≤ 2592 {
    N_CW=2;
    L_LDPC=1296;
}
elseif 2592 < N_avbits {
    N_CW= ceil ((LENGTH × 8 + 16) / (1944 × R));
    L_LDPC=1944;
}.
```

(10) The device of (5), further comprising logic circuits that implement an if-elseif structure comprising:

```
if N_avbits ≤ 648 {
    N_CW=1;
    L_LDPC=648;
}
elseif 648 < N_avbits ≤ 1296 {
    N_CW=1;
    L_LDPC=1296;
}
elseif 1296 < N_avbits ≤ 1944 {
    N_CW=1;
    L_LDPC=1944;
}
elseif 1944 < N_avbits ≤ 2592 {
    N_CW=2;
    L_LDPC=1296;
}
elseif 2592 < N_avbits {
    N_CW= ceil ((LENGTH × 8 + 16) / (1944 × R));
    L_LDPC=1944;
}.
```

(11) The device of (5), embodied in a WLAN device that is coupled during use to a WLAN receiver.

(12) A computer program product embodied on a computer readable medium and comprising program instructions the execution of which by a data processor of a wireless transmitter result in operations that comprise: determining a number of available bits ($N_{avbits}$) in a minimum number of orthogonal frequency division multiplex (OFDM) symbols in which a data field of a packet may fit, in accordance with $$N_{avbits}=(1+N_{CBPS}*(1U_{STBC}))*\text{ceil}(N_{pld}/(N_{CBPS}*R*(1U_{STBC}))),$$

where $U_{STBC}$ equals 1 when Space-Time Block Code (STBC) is used and 0 otherwise, where $N_{pld}$=LENGTH*8+16, where $N_{CBPS}$ is the number of coded bits per symbol, where R is the code rate, and where LENGTH is a number of bytes in a Physical Layer Convergence Protocol (PLCP) PLCP Service Data Unit (PSDU); and determining an integer number of Low-Density Parity-Check Code (LDPCC) codewords to be transmitted, $N_{CW}$, and the length of the codewords to be used, $L_{LDPC}$, from information expressible in a Table format and comprising:

| $N_{avbits}$ range (bits) | Number of LDPCC codewords $N_{CW}$ | LDPC codeword length $L_{LDPC}$ (bits) |
|---|---|---|
| $N_{avbits} \leq 648$ | 1 | 648 |
| $648 < N_{avbits} \leq 1296$ | 1 | 1296 |
| $1296 < N_{avbits} \leq 1944$ | 1 | 1944 |
| $1944 < N_{avbits} \leq 2592$ | 2 | 1296 |
| $2592 < N_{avbits}$ | $\text{ceil}\frac{((LENGTH \times 8 + 16)}{(1944 \times R))}$ | 1944 |

(13) The computer program product of (12), further comprising operations of: computing a number of shortening bits to be padded to the $N_{pld}$ data bits before encoding; computing a number of bits to be punctured from the codewords after encoding; computing a number of coded bits to be repeated; encoding the data, using the number of shortening bits per codeword, and puncture or repeat bits per codeword; and aggregating all codewords and parsing.

(14) The computer program product of (12), executed in a wireless transmitter device.

(15) The computer program product of (12), where certain of the program instructions implement an if-elseif structure comprising:

```
if $N_{avbits} \leq 648$ {
    $N_{CW}$=1;
    $L_{LDPC}$=648;
}
elseif $648 < N_{avbits} \leq 1296$ {
    $N_{CW}$=1;
    $L_{LDPC}$=1296;
}
elseif $1296 < N_{avbits} \leq 1944$ {
    $N_{CW}$=1;
    $L_{LDPC}$=1944;
}
elseif $1944 < N_{avbits} \leq 2592$ {
    $N_{CW}$=2;
    $L_{LDPC}$=1296;
}
elseif $2592 < N_{avbits}$ {
    $N_{CW}$= ceil ((LENGTH × 8 + 16) / (1944 × R));
    $L_{LDPC}$=1944;
}.
```

(16) The computer program product of (12), where certain of the program instructions operate in conjunction with logic circuits to implement an if-elseif structure comprising:

```
if $N_{avbits} \leq 648$ {
    $N_{CW}$=1;
    $L_{LDPC}$=648;
}
elseif $648 < N_{avbits} \leq 1296$ {
    $N_{CW}$=1;
    $L_{LDPC}$=1296;
}
elseif $1296 < N_{avbits} \leq 1944$ {
    $N_{CW}$=1;
    $L_{LDPC}$=1944;
}
elseif $1944 < N_{avbits} \leq 2592$ {
    $N_{CW}$=2;
    $L_{LDPC}$=1296;
}
elseif $2592 < N_{avbits}$ {
    $N_{CW}$= ceil ((LENGTH × 8 + 16) / (1944 × R));
    $L_{LDPC}$=1944;
}.
```

(17) A data structure tangibly embodied in a memory, the data structure defining information expressible in a Table format and comprising:

| $N_{avbits}$ range (bits) | Number of LDPCC codewords $N_{CW}$ | LDPC codeword length $L_{LDPC}$ (bits) |
|---|---|---|
| $N_{avbits} \leq 648$ | 1 | 648 |
| $648 < N_{avbits} \leq 1296$ | 1 | 1296 |
| $1296 < N_{avbits} \leq 1944$ | 1 | 1944 |
| $1944 < N_{avbits} \leq 2592$ | 2 | 1296 |
| $2592 < N_{avbits}$ | $\text{ceil}\frac{((LENGTH \times 8 + 16)}{(1944 \times R))}$ | 1944 | where the information is accessed, using the parameter $N_{avbits}$ that defines a number of available bits in a minimum number of orthogonal frequency division multiplex (OFDM) symbols in which a data field of a packet may fit, to obtain the integer number of Low-Density Parity-Check Code (LDPCC) codewords to be transmitted, $N_{CW}$, and the length of the codewords $L_{LDPC}$.

(18) The data structure of (17), where the parameter $N_{avbits}$ is obtained by: determining $N_{pld}$=LENGTH*8+16, $N_{avbits}=(N_{CBPS}*(1 U_{STBC}))*\text{ceil}(N_{pld}/(N_{CBPS}*R*(1 U_{STBC})))$, where $U_{STBC}$ equals 1 when Space-Time Block Code (STBC) is used and 0 otherwise, where $N_{CBPS}$ is the number of coded bits per symbol, where R is the code rate, and where LENGTH is a number of bytes in a Physical Layer Convergence Protocol (PLCP) PLCP Service Data Unit (PSDU).

(19) An integrated circuit, comprising: circuitry for coupling to a transceiver and operable to determine a number of available bits ($N_{avbits}$) in a minimum number of orthogonal frequency division multiplex (OFDM) symbols in which a data field of a packet may fit, in accordance with $N_{avbits}=(N_{CBPS}*(1 U_{STBC}))*\text{ceil}(N_{pld}/(N_{CBPS}*R*(1 U_{STBC})))$, where $U_{STBC}$ equals 1 when Space-Time Block Code (STBC) is used and 0 otherwise, where $N_{pld}$=LENGTH*8+16, where $N_{CBPS}$ is the number of coded bits per symbol, where R is the code rate, and where LENGTH is a number of bytes in a Physical Layer Convergence Protocol (PLCP) PLCP Service Data Unit (PSDU); and to determine an integer number of Low-Density Parity-Check Code (LDPCC) codewords to be transmitted, $N_{CW}$, and the length of the codewords to be used, $L_{LDPC}$, from information expressible in a Table format and comprising:

| $N_{avbits}$ range (bits) | Number of LDPCC codewords $N_{CW}$ | LDPC codeword length $L_{LDPC}$ (bits) |
|---|---|---|
| $N_{avbits} \leq 648$ | 1 | 648 |
| $648 < N_{avbits} \leq 1296$ | 1 | 1296 |
| $1296 < N_{avbits} \leq 1944$ | 1 | 1944 |
| $1944 < N_{avbits} \leq 2592$ | 2 | 1296 |
| $2592 < N_{avbits}$ | $\text{ceil}\dfrac{((\text{LENGTH} \times 8 + 16)}{(1944 \times R))}$ | 1944 |

(20) The integrated circuit of (19), further comprising a memory that stores a Table that comprises the information.

(21) The integrated circuit of (19), for coupling to a memory that stores a Table that comprises the information.

(22) The integrated circuit of (19), further comprising a memory that stores computer program instructions the execution of which results in generating the information expressible in the Table format.

(23) The integrated circuit of (19), for coupling to a memory that stores computer program instructions the execution of which results in generating the information expressible in the Table format.

(24) The integrated circuit of (22), where certain of the computer program instructions implement an if-elseif structure comprising:

```
if N_avbits ≤ 648 {
    N_CW=1;
    L_LDPC=648;
}
elseif 648 < N_avbits ≤ 1296 {
    N_CW=1;
    L_LDPC=1296;
}
elseif 1296 < N_avbits ≤ 1944 {
    N_CW=1;
    L_LDPC=1944;
}
elseif 1944 < N_avbits ≤ 2592 {
    N_CW=2;
    L_LDPC=1296;
}
elseif 2592 < N_avbits {
    N_CW= ceil ((LENGTH × 8 + 16) / (1944 × R));
    L_LDPC=1944;
}.
```

(25) The integrated circuit of (23), where certain of the computer program instructions implement an if-elseif structure comprising:

```
if N_avbits ≤ 648 {
    N_CW=1;
    L_LDPC=648;
}
elseif 648 < N_avbits ≤ 1296 {
    N_CW=1;
    L_LDPC=1296;
}
elseif 1296 < N_avbits ≤ 1944 {
    N_CW=1;
    L_LDPC=1944;
}
elseif 1944 < N_avbits ≤ 2592 {
    N_CW=2;
    L_LDPC=1296;
}
elseif 2592 < N_avbits {
    N_CW= ceil ((LENGTH × 8 + 16) / (1944 × R));
    L_LDPC=1944;
}.
```

(26) The integrated circuit of (19), further comprising logic circuits that implement an if-elseif structure comprising:

```
if N_avbits ≤ 648 {
    N_CW=1;
    L_LDPC=648;
}
elseif 648 < N_avbits ≤ 1296 {
    N_CW=1;
    L_LDPC=1296;
}
elseif 1296 < N_avbits ≤ 1944 {
    N_CW=1;
    L_LDPC=1944;
}
elseif 1944 < N_avbits ≤ 2592 {
    N_CW=2;
    L_LDPC=1296;
}
elseif 2592 < N_avbits {
    N_CW= ceil ((LENGTH × 8 + 16) / (1944 × R));
    L_LDPC=1944;
}.
```

(27) The integrated circuit of (19), embodied in a WLAN device.

(28) A method to operate a wireless receiver, comprising: receiving a packet; determining from the received packet a modulation coding scheme used at a transmitter and a packet payload size; and based on the modulation coding scheme and the packet payload size, determining a block size and a number of LDPCC codewords $N_{CW}$ in accordance with information expressible in a Table format and comprising:

| $N_{avbits}$ range (bits) | Number of LDPCC codewords $N_{CW}$ | LDPC codeword length $L_{LDPC}$ (bits) |
|---|---|---|
| $N_{avbits} \leq 648$ | 1 | 648 |
| $648 < N_{avbits} \leq 1296$ | 1 | 1296 |
| $1296 < N_{avbits} \leq 1944$ | 1 | 1944 |
| $1944 < N_{avbits} \leq 2592$ | 2 | 1296 |
| $2592 < N_{avbits}$ | $\text{ceil}\dfrac{((\text{LENGTH} \times 8 + 16)}{(1944 \times R))}$ | 1944 |

(29) The method of (28), where the modulation coding scheme and packet payload size are determined from a packet preamble.

(30) The method of (28), executed by a WLAN device.

In general, and as should be apparent, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the exemplary embodiments of this invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

As such, it should be appreciated that at least some aspects of the exemplary embodiments of the inventions may be practiced in various components such as integrated circuit chips and modules. The design of integrated circuits is by and large a highly automated process. Complex and powerful software tools are available for converting a logic level design into a semiconductor circuit design ready to be fabricated on a semiconductor substrate. Such software tools can automatically route conductors and locate components on a semiconductor substrate using well established rules of design, as well as libraries of pre-stored design modules. Once the design for a semiconductor circuit has been completed, the resultant design, in a standardized electronic format (e.g., Opus, GDSII, or the like) may be transmitted to a semiconductor fabrication facility for fabrication as one or more integrated circuit devices.

Various modifications and adaptations may become apparent to those skilled in the relevant arts in view of the foregoing description, when read in conjunction with the accompanying drawings and the appended claims. As but some examples, the use of other similar or equivalent mathematical operations, numbers of bits, field names and the like may be attempted by those skilled in the art. Furthermore, the exemplary embodiments are not restricted for use with RF systems, and may be used as well with optical-based systems. However, all such and similar modifications of the teachings of this invention will still fall within the scope of this invention.

Furthermore, some of the features of the examples of this invention may be used to advantage without the corresponding use of other features. As such, the foregoing description should be considered as merely illustrative of the principles, teachings, examples and exemplary embodiments of this invention, and not in limitation thereof.

What is claimed is:

1. A method, comprising:

determining, by a processor, a number of available bits ($N_{avbits}$) in a minimum number of orthogonal frequency division multiplex (OFDM) symbols in which a data field of a packet may fit, in accordance with $$N_{avbits}=(N_{CBPS}*(1+U_{STBC}))*\text{ceil}(N_{pld}/(N_{CBPS}*R*(1+U_{STBC}))),$$

where $U_{STBC}$ equals 1 when Space-Time Block Code (STBC) is used and 0 otherwise,
where $N_{pld}$=LENGTH*8+16,
where $N_{CBPS}$ is the number of coded bits per symbol,
where R is the code rate,
and
where LENGTH is a number of bytes in a Physical Layer Convergence Protocol (PLCP) PLCP Service Data Unit (PSDU);
determining, by the processor, an integer number of Low-Density Parity-Check Code (LDPCC) codewords to be transmitted, $N_{CW}$, and the length of the codewords to be used, $L_{LDPC}$, from information expressible in a Table format and comprising:

| $N_{avbits}$ range (bits) | Number of LDPCC codewords $N_{CW}$ | LDPC codeword length $L_{LDPC}$ (bits) |
|---|---|---|
| $N_{avbits} \leq 648$ | 1 | 648 |
| $648 < N_{avbits} \leq 1296$ | 1 | 1296 |
| $1296 < N_{avbits} \leq 1944$ | 1 | 1944 |
| $1944 < N_{avbits} \leq 2592$ | 2 | 1296 |
| $2592 < N_{avbits}$ | ceil $\frac{((\text{LENGTH} \times 8 + 16)}{(1944 \times R))}$ | 1944; | and
outputting, by the processor, the determined integer number of LDPCC codewords to be transmitted and the length of the codewords to be used.

2. The method of claim 1, further comprising:
computing a number of shortening bits to be padded to the $N_{pld}$ data bits before encoding;
computing a number of bits to be punctured from the codewords after encoding;
computing a number of coded bits to be repeated;
encoding the data, using the number of shortening bits per codeword, and puncture or repeat bits per codeword; and
aggregating all codewords and parsing.

3. The method of claim 1, executed in a wireless transmitter device.

4. The method of claim 2, executed in a wireless transmitter device.

5. A device, comprising:
a wireless transceiver; and
processing circuitry coupled to the wireless transceiver and operable to determine a number of available bits ($N_{avbits}$) in a minimum number of orthogonal frequency division multiplex (OFDM) symbols in which a data field of a packet may fit, in accordance with $$N_{avbits}=(N_{CBPS}*(1+U_{STBC}))\text{ceil}(N_{pld}/(N_{CBPS}*R*(1+U_{STBC}))),$$

where $U_{STBC}$ equals 1 when Space-Time Block Code (STBC) is used and 0 otherwise,
where $N_{pld}$=LENGTH * 8+16,
where NCBPS is the number of coded bits per symbol,
where R is the code rate,
and
where LENGTH is a number of bytes in a Physical Layer Convergence Protocol (PLCP) PLCP Service Data Unit (PSDU); and to determine an integer number of Low-Density Parity-Check Code (LDPCC) codewords to be transmitted, Ncw, and the length of the codewords to be used, $L_{LDPC}$, from information expressible in a Table format and comprising:

| $N_{avbits}$ range (bits) | Number of LDPCC codewords $N_{CW}$ | LDPC codeword length $L_{LDPC}$ (bits) |
|---|---|---|
| $N_{avbits} \leq 648$ | 1 | 648 |
| $648 < N_{avbits} \leq 1296$ | 1 | 1296 |
| $1296 < N_{avbits} \leq 1944$ | 1 | 1944 |
| $1944 < N_{avbits} \leq 2592$ | 2 | 1296 |

-continued

| $N_{avbits}$ range (bits) | Number of LDPCC codewords $N_{CW}$ | LDPC codeword length $L_{LDPC}$ (bits) |
|---|---|---|
| $2592 < N_{avbits}$ | ceil $\frac{((LENGTH \times 8 + 16)}{(1944 \times R))}$ | 1944, | where the processing circuitry is further operable to output the determined integer number of LDPCC codewords to be transmitted and the length of the codewords to be used.

6. The device of claim 5, further comprising means for computing a number of shortening bits to be padded to the $N_{pld}$ data bits before encoding; for computing a number of bits to be punctured from the codewords after encoding; for computing a number of coded bits to be repeated; for encoding the data, using the number of shortening bits per codeword, and puncture or repeat bits per codeword; and for aggregating all codewords and parsing.

7. The device of claim 5, further comprising a memory that stores a Table that comprises the information.

8. The device of claim 5, further comprising a memory that stores computer program instructions the execution of which by a processor results in generating the information expressible in the Table format.

9. The device of claim 8, where certain of the computer program instructions implement an if-elseif structure comprising:

```
if N_avbits ≤ 648 then
    N_CW=1; and
    L_LDPC=648;
elseif 648 < N_avbits ≤ 1296 then
    N_CW=1; and
    L_LDPC=1296;
elseif 1296 < N_avbits ≤ 1944 then
    N_CW=1; and
    L_LDPC=1944;
elseif 1944 < N_avbits ≤ 2592 then
    N_CW=2; and
    L_LDPC=1296;
elseif 2592 < N_avbits then
    N_CW= ceil ((LENGTH × 8 + 16) / (1944 × R)); and
    L_LDPC=1944.
}.
```

10. The device of claim 5, further comprising logic circuits that implement an if-elseif structure comprising:

```
if N_avbits ≤ 648 then
    N_CW=1; and
    L_LDPC=648;
elseif 648 < N_avbits ≤ 1296 then
    N_CW=1; and
    L_LDPC=1296;
elseif 1296 < N_avbits ≤ 1944 then
    N_CW=1; and
    L_LDPC=1944;
elseif 1944 < N_avbits ≤ 2592 then
    N_CW=2; and
    L_LDPC=1296;
elseif 2592 < N_avbits then
    N_CW= ceil ((LENGTH × 8 + 16) / (1944 × R)); and
    L_LDPC=1944.
```

11. The device of claim 5, embodied in a WLAN device that is coupled during use to a WLAN receiver.

12. A computer program product tangibly embodied on a computer readable medium and comprising program instructions the execution of which by a data processor of a wireless transmitter result in operations that comprise:

determining a number of available bits ($N_{avbits}$) in a minimum number of orthogonal frequency division multiplex (OFDM) symbols in which a data field of a packet may fit, in accordance with $$N_{avbits}=(N_{CBPS}*(1+U_{STBC}))*\text{ceil}(N_{pld}/(N_{CBPS}*R*(1+U_{STBC}))),$$

where $U_{STBC}$ equals 1 when Space-Time Block Code (STBC) is used and 0 otherwise,
where $N_{pld}$=LENGTH * 8+16,
where $N_{CBPS}$ is the number of coded bits per symbol,
where R is the code rate,
and
where LENGTH is a number of bytes in a Physical Layer Convergence Protocol (PLCP) PLCP Service Data Unit (PSDU);

determining an integer number of Low-Density Parity-Check Code (LDPCC) codewords to be transmitted, $N_{CW}$, and the length of the codewords to be used, $L_{LDPC}$, from information expressible in a Table format and comprising:

| $N_{avbits}$ range (bits) | Number of LDPCC codewords $N_{CW}$ | LDPC codeword length $L_{LDPC}$ (bits) |
|---|---|---|
| $N_{avbits} \leq 648$ | 1 | 648 |
| $648 < N_{avbits} \leq 1296$ | 1 | 1296 |
| $1296 < N_{avbits} \leq 1944$ | 1 | 1944 |
| $1944 < N_{avbits} \leq 2592$ | 2 | 1296 |
| $2592 < N_{avbits}$ | ceil $\frac{((LENGTH \times 8 + 16)}{(1944 \times R))}$ | 1944; | and
outputting the determined integer number of LDPCC codewords to be transmitted and the length of the codewords to be used.

13. The computer program product of claim 12, further comprising operations of:
computing a number of shortening bits to be padded to the $N_{pld}$ data bits before encoding;
computing a number of bits to be punctured from the codewords after encoding;
computing a number of coded bits to be repeated;
encoding the data, using the number of shortening bits per codeword, and puncture or repeat bits per codeword; and
aggregating all codewords and parsing.

14. The computer program product of claim 12, executed in a wireless transmitter device.

15. The computer program product of claim 12, where certain of the program instructions implement an if-elseif structure comprising:

```
if N_avbits ≤ 648 then
    N_CW=1; and
    L_LDPC=648;
elseif 648 < N_avbits ≤ 1296 then
```

-continued

```
    N_CW=1; and
    L_LDPC=1296;
elseif 1296 < N_avbits ≤ 1944 then
    N_CW=1; and
    L_LDPC=1944;
elseif 1944 < N_avbits ≤ 2592 then
    N_CW=2; and
    L_LDPC=1296;
elseif 2592 < N_avbits then
    N_CW= ceil ((LENGTH × 8 + 16) / (1944 × R)); and
    L_LDPC=1944.
```

16. The computer program product of claim 12, where certain of the program instructions operate in conjunction with logic circuits to implement an if-elseif structure comprising:

```
if N_avbits ≤ 648 then
    N_CW=1; and
    L_LDPC=648;
elseif 648 < N_avbits ≤ 1296 then
    N_CW=1; and
    L_LDPC=1296;
elseif 1296 < N_avbits ≤ 1944 then
    N_CW=1; and
    L_LDPC=1944;
elseif 1944 < N_avbits ≤ 2592 then
    N_CW=2; and
    L_LDPC=1296;
elseif 2592 < N_avbits then
    N_CW= ceil ((LENGTH × 8 + 16) / (1944 × R)); and
    L_LDPC=1944.
```

17. A data structure tangibly embodied in a memory, the data structure defining information expressible in a Table format and comprising:

| $N_{avbits}$ range (bits) | Number of LDPCC codewords $N_{CW}$ | LDPC codeword length $L_{LDPC}$ (bits) |
|---|---|---|
| $N_{avbits} \leq 648$ | 1 | 648 |
| $648 < N_{avbits} \leq 1296$ | 1 | 1296 |
| $1296 < N_{avbits} \leq 1944$ | 1 | 1944 |
| $1944 < N_{avbits} \leq 2592$ | 2 | 1296 |
| $2592 < N_{avbits}$ | $\text{ceil} \dfrac{((LENGTH \times 8 + 16)}{(1944 \times R))}$ | 1944, | where LENGTH is a number of bytes in a Physical Layer Convergence Protocol (PLCP) PLCP Service Data Unit (PSDU), where the information is accessed, using the parameter $N_{avbits}$ that defines a number of available bits in a minimum number of orthogonal frequency division multiplex (OFDM) symbols in which a data field of a packet may fit, to obtain the integer number of Low-Density Parity-Check Code (LDPCC) codewords to be transmitted, $N_{CW}$, and the length of the codewords $L_{LDPC}$.

18. The data structure of claim 17, where the parameter $N_{avbits}$ is obtained by:
determining $N_{pld}$=LENGTH*8+16, $N_{avbits}=(N_{CBPS}*(1+U_{STBC}))*\text{ceil}(N_{pld}/(N_{CBPS}*R*(1+U_{STBC})))$, where $U_{STBC}$ equals 1 when Space-Time Block Code (STBC) is used and 0 otherwise, where $N_{CBPS}$ is the number of coded bits per symbol,
where R is the code rate,
and
where LENGTH is a number of bytes in a Physical Layer Convergence Protocol (PLCP) PLCP Service Data Unit (PSDU).

19. An integrated circuit, comprising:
processing circuitry operable for coupling to a transceiver and further operable to determine a number of available bits ($N_{avbits}$) in a minimum number of orthogonal frequency division multiplex (OFDM) symbols in which a data field of a packet may fit, in accordance with $N_{avbits}=(N_{CBPS}*(1+U_{STBC}))*\text{ceil}(N_{pld}/(N_{CBPS}*R*(1+U_{STBC})))$, where $U_{STBC}$ equals 1 when Space-Time Block Code (STBC) is used and 0 otherwise,
where $N_{pld}$=LENGTH * 8+16,
where $N_{CBPS}$ is the number of coded bits per symbol,
where R is the code rate,
and
where LENGTH is a number of bytes in a Physical Layer Convergence Protocol (PLCP) PLCP Service Data Unit (PSDU); and to determine an integer number of Low-Density Parity-Check Code (LDPCC) codewords to be transmitted, $N_{CW}$, and the length of the codewords to be used, $L_{LDPC}$, from information expressible in a Table format and comprising:

| $N_{avbits}$ range (bits) | Number of LDPCC codewords $N_{CW}$ | LDPC codeword length $L_{LDPC}$ (bits) |
|---|---|---|
| $N_{avbits} \leq 648$ | 1 | 648 |
| $648 < N_{avbits} \leq 1296$ | 1 | 1296 |
| $1296 < N_{avbits} \leq 1944$ | 1 | 1944 |
| $1944 < N_{avbits} \leq 2592$ | 2 | 1296 |
| $2592 < N_{avbits}$ | $\text{ceil} \dfrac{((LENGTH \times 8 + 16)}{(1944 \times R))}$ | 1944, | where the processing circuitry is further operable to output the determined integer number of LDPCC codewords to be transmitted and the length of the codewords to be used.

20. The integrated circuit of claim 19, further comprising a memory that stores a Table that comprises the information.

21. The integrated circuit of claim 19, for coupling to a memory that stores a Table that comprises the information.

22. The integrated circuit of claim 19, further comprising a memory that stores computer program instructions the execution of which by a processor results in generating the information expressible in the Table format.

23. The integrated circuit of claim 19, for coupling to a memory that stores computer program instructions the execution of which by a processor results in generating the information expressible in the Table format.

24. The integrated circuit of claim 22, where certain of the computer program instructions implement an if-elseif structure comprising:

```
if N_avbits ≤ 648 then
    N_CW=1; and
    L_LDPC=648;
```

-continued

```
elseif 648 < N_avbits ≤ 1296 then
    N_CW=1; and
    L_LDPC=1296;
elseif 1296 < N_avbits ≤ 1944 then
    N_CW=1; and
    L_LDPC=1944;
elseif 1944 < N_avbits ≤ 2592 then
    N_CW=2; and
    L_LDPC=1296;
elseif 2592 < N_avbits then
    N_CW= ceil ((LENGTH × 8 + 16) / (1944 × R)); and
    L_LDPC=1944.
```

25. The integrated circuit of claim 23, where certain of the computer program instructions implement an if-elseif structure comprising:

```
if N_avbits ≤ 648 then
    N_CW=1; and
    L_LDPC=648;
elseif 648 < N_avbits ≤ 1296 then
    N_CW=1; and
    L_LDPC=1296;
elseif 1296 < N_avbits ≤ 1944 then
    N_CW=1; and
    L_LDPC=1944;
elseif 1944 < N_avbits ≤ 2592 then
    N_CW=2; and
    L_LDPC=1296;
elseif 2592 < N_avbits then
    N_CW= ceil ((LENGTH × 8 + 16) / (1944 × R)); and
    L_LDPC=1944.
```

26. The integrated circuit of claim 19, further comprising logic circuits that implement an if-elseif structure comprising:

```
if N_avbits ≤ 648 then
    N_CW=1; and
    L_LDPC=648;
elseif 648 < N_avbits ≤ 1296 then
    N_CW=1; and
    L_LDPC=1296;
elseif 1296 < N_avbits ≤ 1944 then
    N_CW=1; and
    L_LDPC=1944;
elseif 1944 < N_avbits ≤ 2592 then
    N_CW=2; and
    L_LDPC=1296;
elseif 2592 < N_avbits then
    N_CW= ceil ((LENGTH × 8 + 16) / (1944 × R)); and
    L_LDPC=1944.
```

27. The integrated circuit of claim 19, embodied in a WLAN device.

28. A method to operate a wireless receiver, comprising:
receiving a packet;
determining from the received packet a modulation coding scheme used at a transmitter and a packet payload size; and
based on the modulation coding scheme and the packet payload size, determining a block size and a number of LDPCC codewords $N_{CW}$ in accordance with information expressible in a Table format and comprising:

| $N_{avbits}$ range (bits) | Number of LDPCC codewords $N_{CW}$ | LDPC codeword length $L_{LDPC}$ (bits) |
|---|---|---|
| $N_{avbits} \leq 648$ | 1 | 648 |
| $648 < N_{avbits} \leq 1296$ | 1 | 1296 |
| $1296 < N_{avbits} \leq 1944$ | 1 | 1944 |
| $1944 < N_{avbits} \leq 2592$ | 2 | 1296 |
| $2592 < N_{avbits}$ | $\mathrm{ceil}\dfrac{((\mathrm{LENGTH} \times 8 + 16)}{(1944 \times R))}$ | 1944, | where $N_{avbits}$ defines a number of available bits in a minimum number of orthogonal frequency division multiplex (OFDM) symbols in which a data field of a packet may fit,
where R is the code rate, and
where LENGTH is a number of bytes in a Physical Layer Convergence Protocol (PLCP) PLCP Service Data Unit (PSDU).

29. The method of claim 28, where the modulation coding scheme and packet payload size are determined from a packet preamble.

30. The method of claim 28, executed by a WLAN device.

* * * * *

UNITED STATES PATENT AND TRADEMARK OFFICE
CERTIFICATE OF CORRECTION

PATENT NO.         : 7,664,008 B2                                  Page 1 of 1
APPLICATION NO.    : 11/481531
DATED              : February 16, 2010
INVENTOR(S)        : Stolpman et al.

It is certified that error appears in the above-identified patent and that said Letters Patent is hereby corrected as shown below:

Claim 5, col. 16, line 41 insert --*-- in between )) and ceil.

Signed and Sealed this

Thirteenth Day of April, 2010

David J. Kappos
*Director of the United States Patent and Trademark Office*